United States Patent
Pai et al.

(10) Patent No.: US 8,748,085 B2
(45) Date of Patent: Jun. 10, 2014

(54) USE OF PHOTOSENSITIZED EPON EPOXY RESIN 1002F FOR MEMS AND BIOMEMS APPLICATIONS

(75) Inventors: Jeng-Hao Pai, Chapel Hill, NC (US); Yuli Wang, Cary, NC (US); Christopher E. Sims, Chapel Hill, NC (US); Mark Bachman, Irvine, CA (US); Nancy Allbritton, Chapel Hill, NC (US); Guann-Pyng Li, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 395 days.

(21) Appl. No.: 12/670,349

(22) PCT Filed: Jul. 25, 2008

(86) PCT No.: PCT/US2008/071242
§ 371 (c)(1),
(2), (4) Date: Jul. 13, 2010

(87) PCT Pub. No.: WO2009/015361
PCT Pub. Date: Jan. 29, 2009

(65) Prior Publication Data
US 2011/0223545 A1   Sep. 15, 2011

Related U.S. Application Data

(60) Provisional application No. 60/951,899, filed on Jul. 25, 2007.

(51) Int. Cl.
*G03F 7/26* (2006.01)
(52) U.S. Cl.
USPC .......................................................... 430/322

(58) Field of Classification Search
USPC .......................................................... 430/322
See application file for complete search history.

(56) References Cited

U.S. PATENT DOCUMENTS

| 5,300,402 A | 4/1994 | Card, Jr. et al. |
| 5,998,129 A | 12/1999 | Schutze et al. |

(Continued)

FOREIGN PATENT DOCUMENTS

| WO | WO 97/29355 A1 | 8/1997 |
| WO | WO 02/094454 A1 | 11/2002 |

(Continued)

OTHER PUBLICATIONS

Pai, "Photoresist with Low Fluorescence for Bioanalytical Applications", Anal. Chem. 2007, 79, pp. 8774-8780.*

(Continued)

*Primary Examiner* — Kathleen Duda
(74) *Attorney, Agent, or Firm* — Kenneth S. Roberts; One LLP

(57) ABSTRACT

Systems and methods directed to the use 1002F to build microdevices and biomedical devices. Through the addition of a photosensitizing agent, Epon epoxy resin 1002F can be linked in the presence of UV light, making it useful as a photoresist or as a micropatternable structural material. One embodiment comprises combining 1002F monomer resin with a solvent and a photoinitiator, placing the monomer solution on a surface, exposing the monomer solution to UV light through a mask to initiate linking, and stripping the unlinked polymer away. In another embodiment, 3-D structures are built using two or more layers of sensitized monomer films, each having different sensitivity to light, and the use of a mask containing opaque and semi-opaque regions.

8 Claims, 5 Drawing Sheets

(56) References Cited

U.S. PATENT DOCUMENTS

| | | | |
|---|---|---|---|
| 6,090,919 | A | 7/2000 | Cormack et al. |
| 6,529,835 | B1 | 3/2003 | Wada et al. |
| 2001/0006815 | A1 | 7/2001 | Rabbani et al. |
| 2001/0048977 | A1 | 12/2001 | Dorozhkina et al. |
| 2001/0055882 | A1 | 12/2001 | Ostuni et al. |
| 2002/0119578 | A1 | 8/2002 | Zaffaroni et al. |
| 2003/0059764 | A1 | 3/2003 | Ravkin et al. |
| 2003/0129741 | A1 | 7/2003 | Ramstad |
| 2003/0165771 | A1 | 9/2003 | Jakubek et al. |
| 2004/0028875 | A1 | 2/2004 | Van Rijn et al. |
| 2004/0067596 | A1 | 4/2004 | Halverson et al. |
| 2004/0087052 | A1 | 5/2004 | Kalakis et al. |
| 2004/0171135 | A1 | 9/2004 | Ostuni et al. |
| 2005/0106504 | A1 | 5/2005 | Jakubek et al. |
| 2005/0277053 | A1 | 12/2005 | Platzer et al. |
| 2006/0013031 | A1 | 1/2006 | Ravkin et al. |
| 2006/0121500 | A1 | 6/2006 | Bachman et al. |
| 2007/0128716 | A1 | 6/2007 | Wang et al. |
| 2007/0161100 | A1 | 7/2007 | Tanaka et al. |
| 2007/0166816 | A1 | 7/2007 | Campbell et al. |
| 2007/0238122 | A1 | 10/2007 | Allbritton et al. |
| 2007/0292312 | A1 | 12/2007 | Bachman et al. |

FOREIGN PATENT DOCUMENTS

| | | |
|---|---|---|
| WO | WO 03/016868 A1 | 2/2003 |
| WO | WO 03/035824 A1 | 5/2003 |
| WO | WO 03/039750 A1 | 5/2003 |
| WO | WO 2004/024328 A1 | 3/2004 |
| WO | WO 2006/041938 A1 | 4/2006 |
| WO | WO 2006/060922 A1 | 6/2006 |

OTHER PUBLICATIONS

Pai, "1002F Recipes" from http://wikis.lib.ncsu.edu/images/b/bb/1002F_Recipes.pdf, dated Jun. 14, 2007.*
US, Office Action (U.S. Appl. No. 11/733,053), Aug. 18, 2008.
WO, International Search Report and Written Opinion, Sep. 26, 2008.
WO, International Search Report and Written Opinion, Oct. 15, 2008.
US, Office Action (U.S. Appl. No. 11/243,926), Oct. 20, 2008.
US, Office Action (U.S. Appl. No. 11/243,926), Mar. 16, 2009.
EP, Supplemental Search Report (05802866.3), May 7, 2009.
US, Office Action (U.S. Appl. No. 11/733,053), Sep. 10, 2009.
US, Office Action (U.S. Appl. No. 11/539,695), Dec. 4, 2009.
Hexion Specialty Chemicals, Technical Data Sheet, EPON Resin 1002F, http://www.resins.com/resins/am/pdf/RP3063.pdf 2005.
Barron et al., "Laser Printing of Single Cells: Statistical Analysis, Cell Viability, and Stress," Annals of Biomedical Engineering, 33:2, pp. 121-130 (Feb. 2005).
Langer et al., "Live cell catapulting and recultivation does not change the karyotype of HCT116 tumor cells," Cancer Genetics an Cytogenetics, No. 161 pp. 174-177 (2005).
Stich et al., "Live Cell Catapulting and Recultivation," Pathology Research and Practice, 199:6, pp. 405-409 (Jan. 1, 2003).
Watson, Molecular Biology of the Gene, Third Edition, W.A. Benjamin, Inc., Menlo Park, CA, 1976, p. 62.
Zoeller et al., Strategies for Isolating Somatic Cell Mutants Defective in Liquid Biosynthesis, Methods of Enzymology, vol. 2, pp. 34-51 (1992).

* cited by examiner

USE OF PHOTOSENSITIZED EPON EPOXY RESIN 1002F FOR MEMS AND BIOMEMS APPLICATIONS

This invention was made with government support under grants EB004436 and EB004597 awarded by the National Institute of Health. The government has certain rights in the invention.

FIELD

The present invention relates to the field of micromechanical devices, nanostructures, and micro-biodevices and, more particularly, to the use of a currently available material, Epon epoxy resin 1002F.

BACKGROUND

Microelectrical-mechanical systems (MEMS) are miniature mechanical devices intended to perform non-electronic functions such as sensing or actuation. These devices are typically built from silicon using lithographic techniques borrowed from the semiconductor industry. Some examples of these devices are silicon pressure sensors and silicon accelerometers. Other manufacturing methods have been developed such as microembossing, stamping, microinjection molding, precision machining, and the like. These are typically used to build devices from non-silicon materials such as polymer or metal, for applications where silicon is not an appropriate material, particularly in life science applications. Examples of such devices include microfluidic devices, biochips and optical devices.

In the past decade a photosensitized polymer based on the epoxy resin Epon SU-8 (available from Microchem, Inc., Newton, Mass.) has become a popular alternative to silicon for forming micro and nanostructures. When sensitized (by blending the appropriate photosensitizing agent), this material can be crosslinked in the presence of UV light, making it photopatternable. The most common use for SU-8 is to build small epoxy structures using optical lithography. The SU-8 devices benefit from lower manufacturing costs (silicon etch is avoided), large aspect ratios (10:1 is common), optical transparency, and non-silicon surfaces (better for biological applications).

Despite SU-8's popularity, it has some significant drawbacks. Among these are (1) it is brittle, prone to shattering when stressed; and (2) it has high fluorescence making it unsuitable for fluorescent imaging applications. Brittle material properties are undesirable for many applications, particularly those that require some flexure or ruggedness, such as in stents or implants. Fluorescence is also undesirable since the material will generate much background light when performing fluorescent assays on it. We have found that Epon epoxy resin 1002F can be made photosensitive in the same way as SU-8, but is neither brittle nor fluorescent.

Epon epoxy resin SU-8 is a cross-linked polymer that has 8 epoxide groups in its monomer form. When cross-linked these produce a highly three-dimensional thermoset that is very rigid and strong, but also brittle. Epon epoxy resin 1002F is also an epoxy polymer, but it contains only two epoxy groups in its monomer form. When these monomers are linked, they form two-dimensional sheets, resulting in a thermoplastic material that has lower strength and rigidity, but can tolerate greater stress before failure. Also, we have observed that the Epon epoxy resin 1002F material has lower fluorescence properties than the SU-8 resin.

SUMMARY

The various embodiments and examples provided herein are generally directed to the novel use of Epon epoxy resin 1002F as a material for lithographically fabricating microdevices, and to various methods of manufacture when using 1002F to build microdevices and biomedical devices. Although readily available in industry, Epon epoxy resin 1002F, which is an epoxy-based polymer resin, has not been used for the manufacture of microdevices or biomedical devices. Through the addition of a photosensitizing agent, Epon epoxy resin 1002F can be linked in the presence of UV light, making it useful as a photoresist or as a micropatternable structural material.

One embodiment comprises combining 1002F monomer resin with a solvent and a photoinitiator, placing the monomer solution on a surface, exposing the monomer solution to UV light through a mask to initiate linking, and stripping the unlinked polymer away. In another embodiment, 3-D structures are built using two or more layers of sensitized monomer films, each having different sensitivity to light, and the use of a mask containing opaque and semi-opaque regions.

Other systems, methods, features and advantages of the invention will be or will become apparent to one with skill in the art upon examination of the following figures and detailed description.

BRIEF DESCRIPTION DRAWINGS

The details of the invention, including fabrication, structure and operation, may be gleaned in part by study of the accompanying figures, in which like reference numerals refer to like parts. The components in the figures are not necessarily to scale, emphasis instead being placed upon illustrating the principles of the invention. Moreover, all illustrations are intended to convey concepts, where relative sizes, shapes and other detailed attributes may be illustrated schematically rather than literally or precisely.

Figure 9:
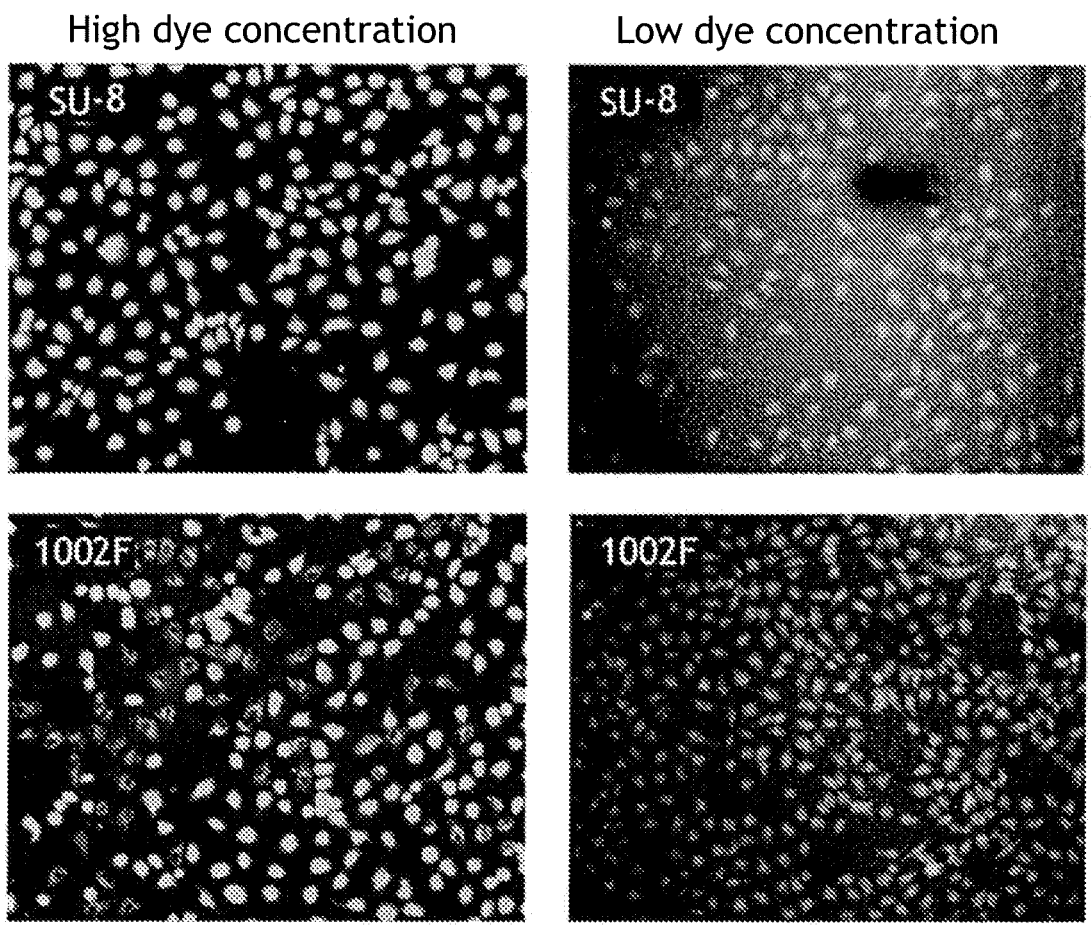

FIG. 9 comprises four top view images showing background fluorescence of epoxy materials SU-8 and 1002F with cells cultured on surface.

DESCRIPTION

Each of the additional features and teachings disclosed below can be utilized separately or in conjunction with other features and teachings to produce microdevices from Epon epoxy resin 1002F. Representative examples of the present invention, which examples utilize many of these additional features and teachings both separately and in combination, will now be described in further detail with reference to the attached drawings. This detailed description is merely intended to teach a person of skill in the art further details for practicing preferred aspects of the present teachings and is not intended to limit the scope of the invention. Therefore, combinations of features and steps disclosed in the following detail description may not be necessary to practice the invention in the broadest sense, and are instead taught merely to particularly describe representative examples of the present teachings.

Moreover, the various features of the representative examples and the dependent claims may be combined in ways that are not specifically and explicitly enumerated in order to provide additional useful embodiments of the present teachings. In addition, it is expressly noted that all features disclosed in the description and/or the claims are intended to be disclosed separately and independently from each other for the purpose of original disclosure, as well as for the purpose of restricting the claimed subject matter independent of the compositions of the features in the embodiments and/or the claims. It is also expressly noted that all value ranges or indications of groups of entities disclose every possible intermediate value or intermediate entity for the purpose of original disclosure, as well as for the purpose of restricting the claimed subject matter.

The various embodiments and examples provided herein were described in U.S. Provisional application No. 60/951,899, which is incorporated herein by reference.

The various embodiments and examples provided herein are generally directed to the novel use of Epon epoxy resin 1002F as a material for lithographically fabricating microdevices. Through the addition of a photosensitizing agent, it can be linked in the presence of UV light, making it useful as a photoresist or as a micropatternable structural material.

To prepare the resin for photolithography, 1002F resin is mixed with a suitable solvent and photoacid generator. In a preferred embodiment, these are γ-Butyrolactone (solvent), and triarylsulfonium hexafluoroantimonate salts, mixed 50 wt. % in propylene carbonate (photoacid generator). These may be combined in various ratios, and in a preferred embodiment at a ratio of 10:5.4:1, although other ratios may be used if greater light sensitivity is required. This photosensitized 1002F solvent mixture is preferably stored in a dark container prior to use.

Figure 1:
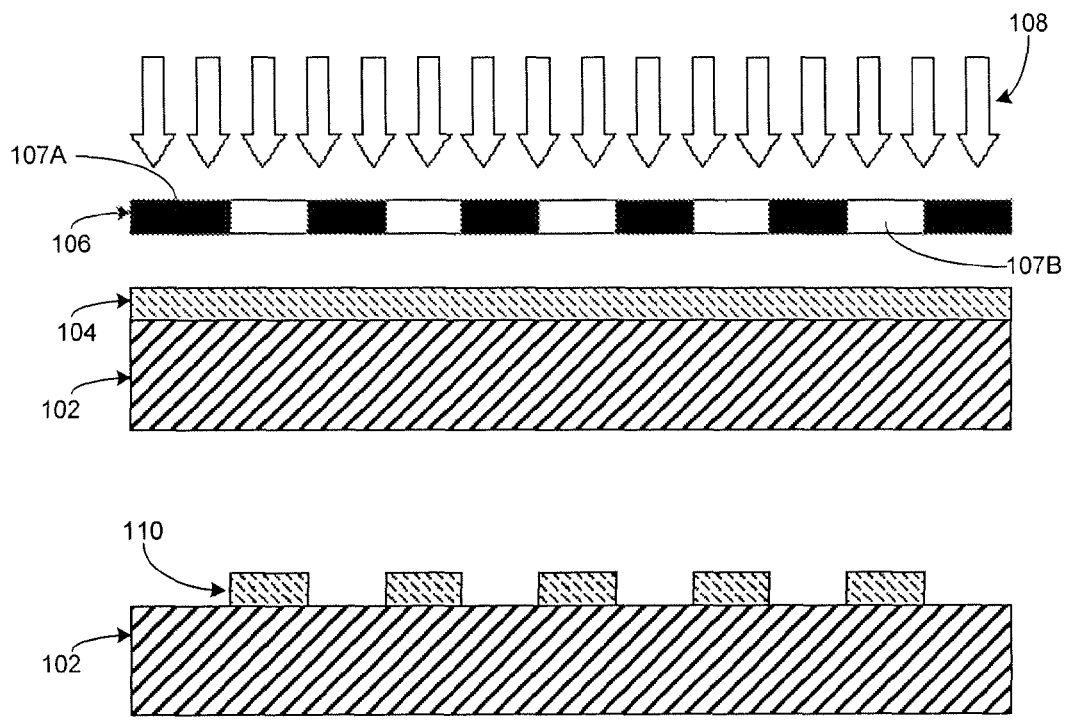
FIG. 1 is a diagram of basic process flow for producing microstructures using Epon epoxy resin 1002F.

Referring to FIG. 1, a photosensitized 1002F solvent mixture is placed on the surface of a substrate 102 such as glass or the like by any convenient means including spinning, painting, dipping, pouring, casting, and the like. The solvent is dried off to leave a semi-dry film of 1002F monomer 104. The film may be further processed at this point, for example by planarizing, cutting, embossing, and the like. This film is exposed through a mask 106 to UV light 108, preferably approximately 365 nm in wavelength, although most UV wavelengths will suffice. The mask 106 has regions that are opaque 107A and transparent 107B to the UV light 108, thus only certain regions of the 1002F film 104 are exposed to UV light 108. These regions are cross-linked by the UV light 108 and photoacid generator in the film 104.

After exposure, the film 104 is "post baked" by raising the temperature of the film 104. Various temperatures may be used, but in a preferred embodiment the post bake temperature is approximately 95° C. Higher temperatures risk linking unexposed portions of the film 104. After post-bake, the film 104 is washed in a solvent bath to strip away the portions of the film that were not linked, leaving behind solid structures 110 of the linked 1002F that reproduce the shape of the transparent regions of the mask 106. The solid structures 110 of linked 1002F may be further processed at this point.

A number of processes techniques may be applied to the solid structures 110 of linked 1002F at this point that make the micropatterned material more useful. The simplest step is to further bake the material to ensure complete linking of the material. Alternatively, the material may be baked slowly and cooled slowly to anneal the material, reducing overall stress in the material and removing some cracks. Alternatively, the material, which is still somewhat soft, may be embossed to introduce new patterns. Alternatively, the material, which is somewhat sticky at this point, may be used as an adhesive to bond to a second material.

Although this embodiment describes a film, the same methods can be applied to bulk materials of photosensitized 1002F monomer. In other embodiments, the photosensitized 1002F monomer is pre-dried and stored as solid pellets which are then embossed onto a surface prior to lithography. In a preferred embodiments, the surfaces of the 1002F structure are flat. However, the surface may be circular, or irregularly shaped also.

Figure 3:
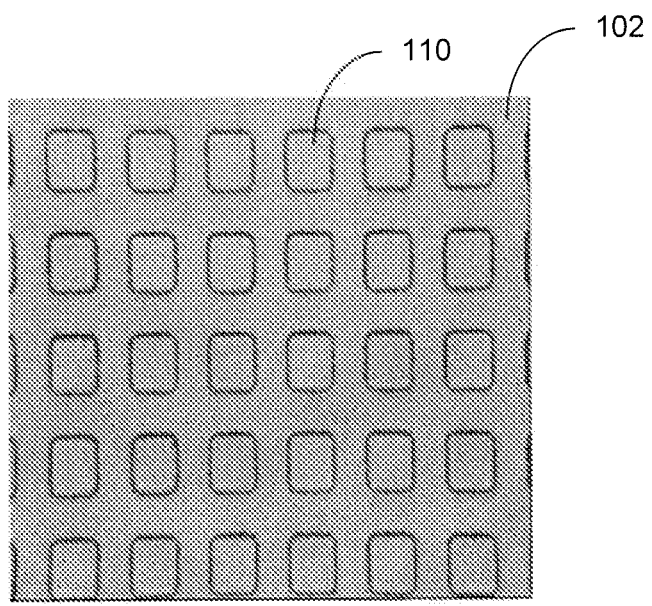
FIG. 3 is a top view optical image of patterned 1002F material.
Figure 4:
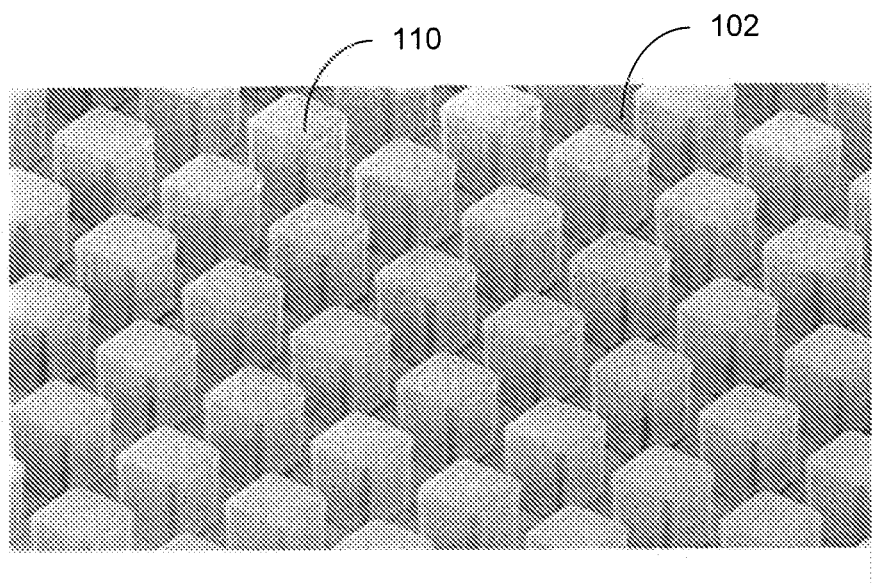
FIG. 4 is a perspective view scanning electron micrograph of patterned 1002F material.
Figure 5:
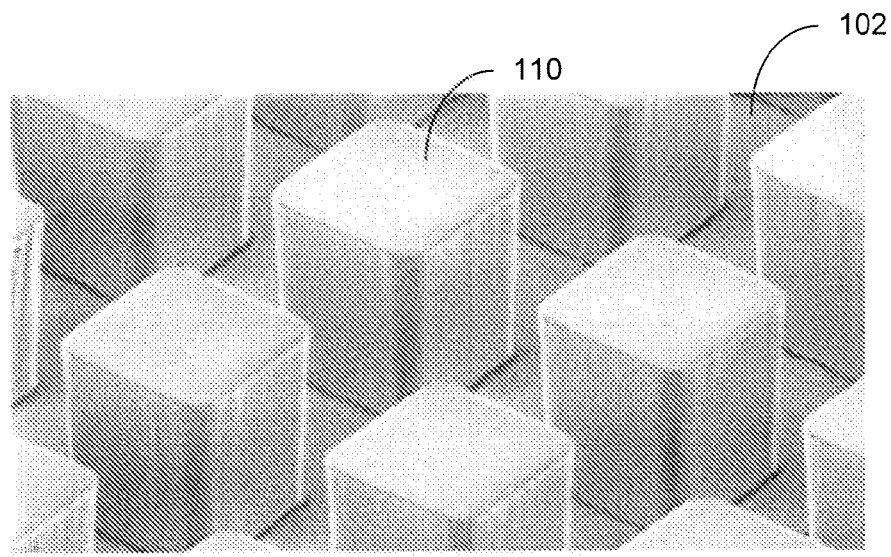
FIG. 5 is a perspective view scanning electron micrograph of patterned 1002F material (higher magnification).
Figure 6:
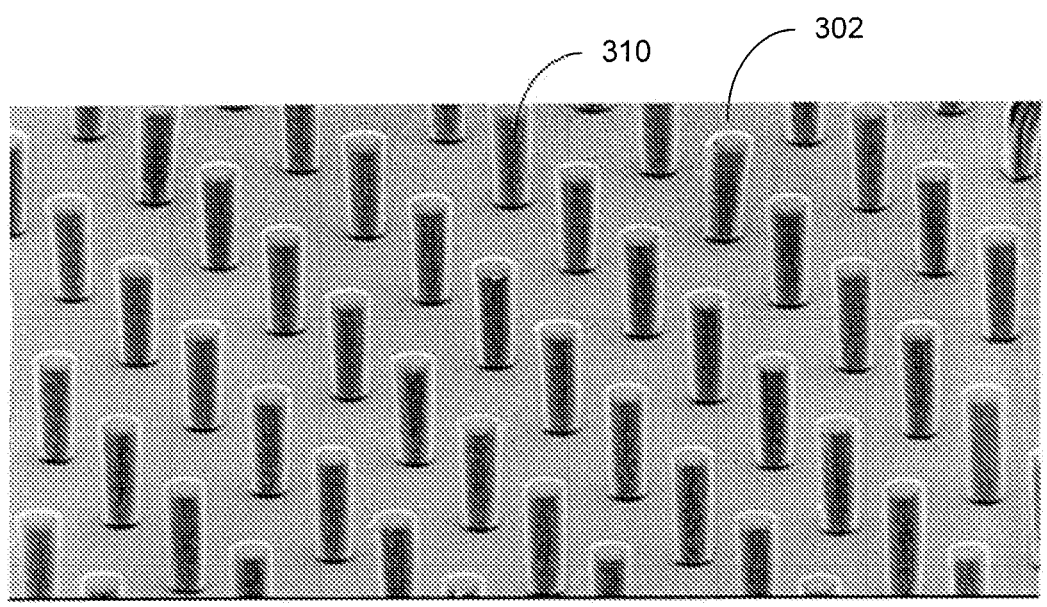
FIG. 6 is a perspective view scanning electron micrograph of high aspect ratio structures patterned 1002F material.

Turning to FIGS. 3 through 6, images of structures formed by the process illustrated in FIG. 1 using photosensitized 1002F material are shown. In FIG. 3, 50 μm square structures 110 are shown formed on a substrate 102. 50 μm square by 75 μm high cubes 110 are shown formed on a substrate 102 in FIGS. 4 and 5, 25 μm diameter by 100 μm high cylindrical structures 310 are shown formed on a substrate 302 in FIG. 6.

Figure 2:
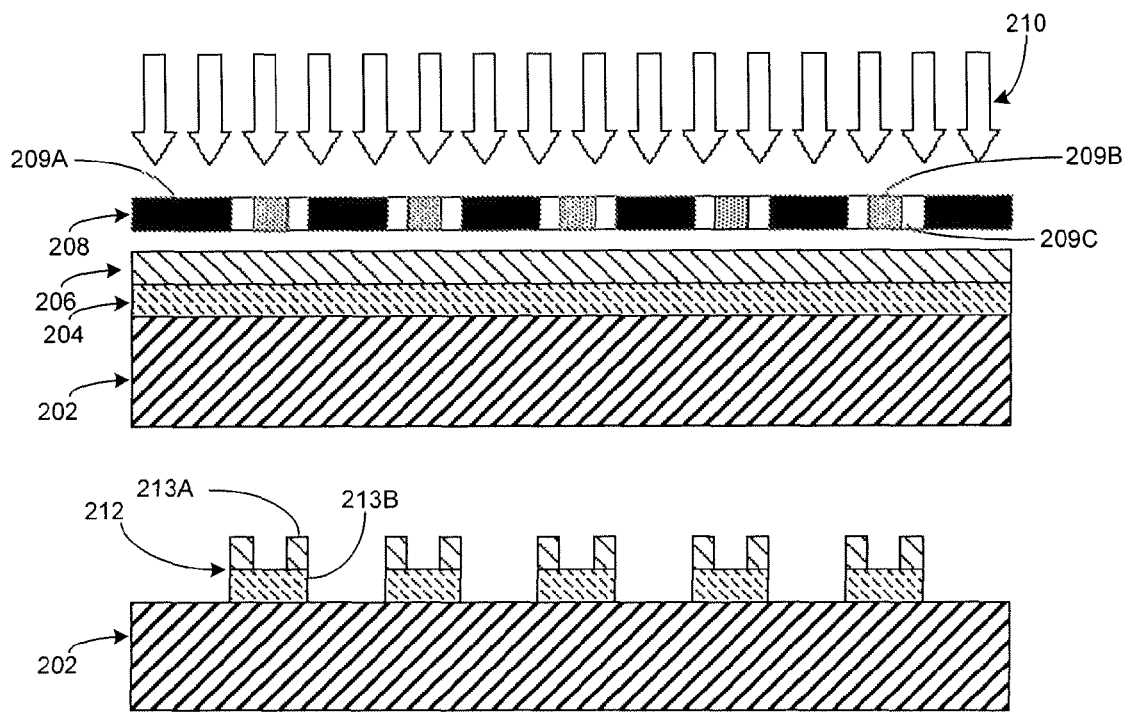
FIG. 2 is a diagram of process for building 3-D structures using two layers of sensitized monomer films, each having different sensitivity to light, and the use of a mask containing opaque and semi-opaque regions.

A variation of the processing depicted in FIG. 1 is described with regard to FIG. 2 in which two film layers 204 and 206 formed from mixtures of photosensitized polymers are prepared in order to produce novel 3-D structures. As depicted in FIG. 2, two photosensitized monomer solvent mixtures are prepared as first and second film layers 204 and 206 on the surface of a substrate 202 such as glass or the like. The first and second film layers 204 and 206 may both be prepared from 1002F, or may be of the more popular SU-8 or a combination of both. One mixture used to form one film layer is prepared with a high photoacid content, and the second mixture used to form the other film layer is prepared with a low photoacid content. As depicted, the first film layer 204 is prepared from the high sensitivity material while the second film layer 206 is prepared from the low sensitivity material. The layers 204 and 206 can be reversed if desired for different effect. The double layer is exposed to UV light 210 under a mask 208 that contains opaque regions 209A, semi-opaque (gray) regions 209B, and transparent regions 209C. The regions 209A that are opaque will not link either layer 204 or 206. The regions 209C that are transparent will link both layers 204 and 206. The regions 209B that are semi-opaque (gray) will link only the high sensitivity layer which is the first layer 204 in this instance. As a result, the one mask 208 can advantageously pattern the two layers 204 and 206 simultaneously with different patterns, which can result in novel 3-D structures 212 using only a single mask 208.

The following properties make the use of Epon epoxy 1002F resin valuable for applications in biomedical devices, particularly for those where fluorescent assays will be performed: (1) the linked 1002F has much lower fluorescent properties than traditional SU-8 epoxy. See, e.g., FIGS. 7 and 8 in which the measured relative fluorescence output for 1002F resin is significantly lower than SU-8 resin with and without a photosensitizer adder (the fluorescence of SU-8 photoresist is shown to be 25 times greater than that of the 1002F resin at 540 nm); (2) the linked 1002F has lower Young's modulus and can withstand greater abuse than traditional SU-8 epoxy; (3) the freshly developed 1002F may be used as an adhesive prior to final bake; (4) the use of multiple layers of different formulations of this material can result in 3-D microstructures using a single mask. These properties also make the use of Epon epoxy 1002F resin valuable for devices that will be exposed to movement such as flexures and devices that need to be rugged, such as stents.

Figure 8:
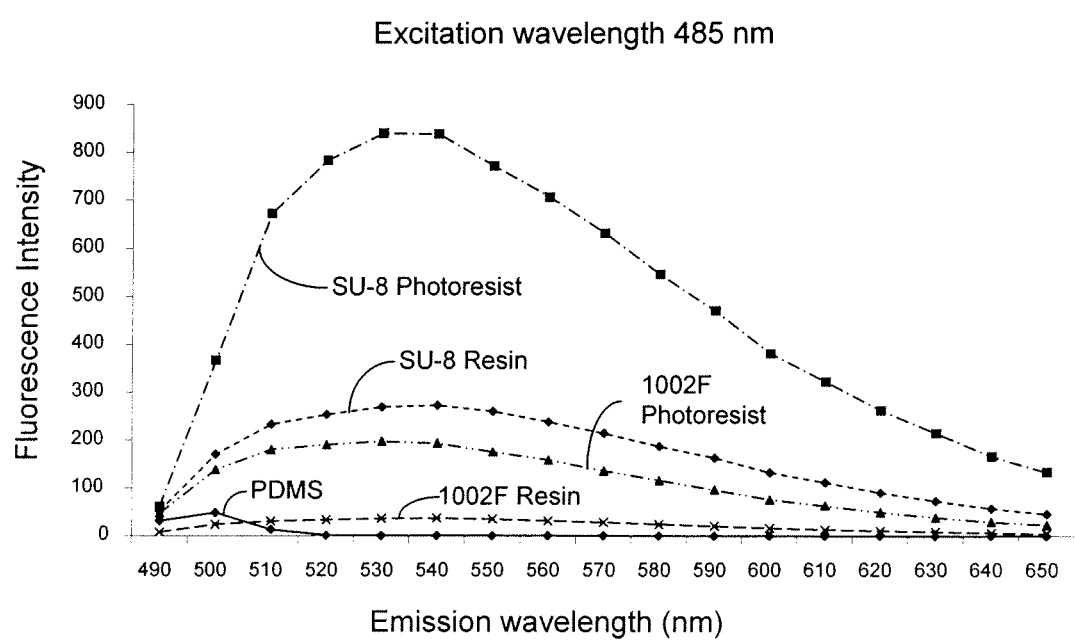
FIG. 8 is a chart showing measured relative fluorescence spectrum for 1002F and SU-8 resins and 1002F and SU-8 photoresists.

As shown in FIG. 8, in the visible wavelengths, the 1002F resin by itself was significantly less fluorescent than the 1002F photoresist. At an emission wavelength of 540 nm the photoresist was over 5 times more fluorescent than the resin. For comparison, the fluorescence of an identical sized block of SU-8 photoresist was 25 times greater than that of the 1002F resin at 540 nm. These results suggested that the photoinitiator or its breakdown products were responsible for the majority of the 1002F photoresist fluorescence. To further decrease the fluorescence of structures composed of 1002F, lower fluorescence photoinitiators are preferred.

Figure 7:
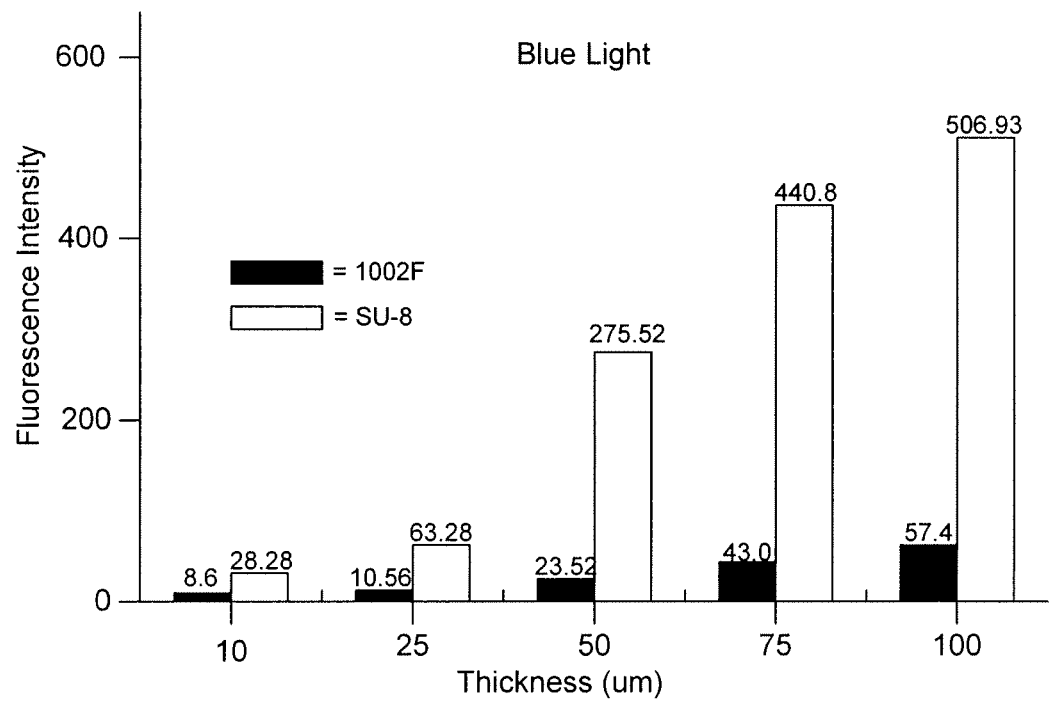
FIG. 7 is a chart showing measured relative fluorescence output for 1002F and SU-8 resins.

The sorting of biological cells from a mixture of cells is frequently performed by labeling the cells with a fluorescent reagent and then selecting those cells with the appropriate level of fluorescence. As shown in FIG. 7, for all pallet thicknesses and excitation/emission wavelengths, pallets formed of SU-8 tend to be substantially more fluorescent than the pallets formed with 1002F. When excited at blue wavelengths, SU-8 pallets 50 μm or greater in thickness possessed over an order of magnitude more fluorescence than the 1002F pallets. As shown in FIG. 8, as the excitation/emission wavelengths increased, the absolute fluorescence of both SU-8 and 1002F decreased. For green excitation wavelengths, the 1002F pallets are as much as 10 times less fluorescent than SU-8. When illuminated with red light, the 1002F pallets are nearly nonfluorescent while the SU-8 pallets continued to display significant fluorescence. These data demonstrate that 1002F is a superior substrate for pallet fabrication when fluorescence is used for detection.

Many bioapplications using photoresists as a structural material, employ absorbance measurements for analyte detection. For this reason, films of SU-8 or 1002F photoresist (250 μm thick) were coated on a slide. The films were exposed to UV light (without a photomask) and baked. The absorbance of the films was then measured. SU-8 and 1002F possessed high transmittance at long wavelengths (500-600 nm). Between 400 and 500 nm, the absorbance of SU-8 increased as the wavelength decreased whereas 1002F remained nearly transparent. By 400 nm, the absorbance of SU-8 was greater than twice that of 1002F. The absorbance of both photoresists increased rapidly as the wavelength decreased below 400 nm; however, at 370 nm the absorbance of 1002F remained half that of SU-8. By 360 nm, both photoresists possessed an absorbance greater than 1. Neither SU-8 nor 1002F are good candidates as structural elements for measurements of absorbance in the ultraviolet wavelengths. However for wavelengths greater than 400 nm, 1002F has excellent potential and is superior to SU-8 as a structural material for applications utilizing absorbance as a detection method. Other potential applications suitable for 1002F include the fabrication of miniaturized, transparent, optical elements such as lenses.

Since cells have difficulty attaching to bare SU-8, coatings must be covalently attached or adsorbed onto the SU-8 surface in order for cells to attach. To assess the ability of 1002F photoresist to support cell adhesion, RBL and A172 cells were cultured on 1002F films placed on glass. Within 2-3 hours, cells were observed to attach and begin spreading on the 1002F surface. Other tested cells (rat fibroblast (208F) and human cervical carcinoma (HeLa)) behaved similarly.

To assess their longer term health, RBL and A172 cells were cultured on glass, SU-8 or 1002F surfaces for varying times and then assayed for their ability to metabolize XTT. In this assay, metabolically active cells convert XTT, a yellow tetrazolium salt, to an orange formazon product. Similar results were obtained for both cell types on the three different surfaces suggesting that none of the materials were toxic to these cells. The cells cultured on SU-8 possessed slightly slower XTT metabolism than those on glass or 1002F likely due to the poor adhesion of cells to the SU-8 surfaces until SU-8 becomes fully coated with adsorbed proteins from the tissue culture medium. These results suggest that many cell types will be able to adhere to and grow on surfaces composed of native 1002F.

For arrays of 1002F pallets to serve as a suitable format for cell selection and sorting, cells must attach to and grow on the top surfaces of the pallets and not on the glass surface between the pallets. A successful strategy to direct cells to the top surface of SU-8 pallets is to coat the array with a hydrophobic silane. Upon immersion of the SU-8 pallet array in an aqueous medium, air is stably trapped between the pallets forming a virtual wall between the pallets. These virtual walls exclude cells from the region between the pallets forcing the cells to attach to the top surfaces of the pallets. To determine whether 1002F pallets could support virtual walls, an array of 1002F pallets was coated with a perfluoroalkylsilane layer ((heptadecafluoro-1,1,2,2-tetrahydrodecyl)trichlorosilane). The array was then coated with collagen and immersed in an aqueous solution. Air trapped between the pallets was readily visualized as was the air/water interface at the edge of the pallet array.

To insure that these air walls could be used to localize cells to the pallet top surfaces, HeLa cells were cultured on the 1002F pallet array with virtual walls. Of 109 HeLa cells visualized, 100% were located on the pallet top surface with 0% on the intervening glass surfaces. Similar results were obtained for a collagen-coated, SU-8 array with virtual walls and cultured HeLa cells.

To assess the viability of the cells cultured on the 1002F array of pallets, the cells were loaded with viability indicator, Oregon Green diacetate. Living cells metabolize the dye to its counterpart, Oregon Green, which exhibits a green fluorescence. All cells on the 1002F array metabolized and retained the dye demonstrating that they were viable. RBL cells were also loaded with Oregon Green on an SU-8 array of pallets for comparison. The most notable difference between the images of the SU-8 and 1002F arrays of pallets, as shown in FIG. 9, is the high background fluorescence of the SU-8 pallets compared to the nonfluorescent, 1002F pallets. These results demonstrate that the 1002F photoresist can be used to form arrays of cells at known locations and with low background fluorescence.

A key aspect of the SU-8 pallet arrays is that individual pallets can be released from the substrate by, e.g., such means as a single focused pulse from a Nd:YAG laser (5 ns, 532 nm, 2 μJ). On-demand, single-pallet release permits the collection of pallets possessing a desired cell and consequently the separation of that cell from the mixture of cells on the array. As with SU-8 pallets, 1002F pallets have been found to be readily releasable individually from the pallet array using low pulse energies. For example, 1002F pallets (50 μm side and height) formed from the process described in FIG. 1 were found to be 100% releasable from the substrate (i.e., glass) when individual pallets in the array were targeted for release using a laser pulse having an energy level that was greater than 4 μJ that was focused at the glass/1002F pallet interface. None of the adjacent, untargeted pallets were released. To determine the threshold energy for pallet release, the probability of releasing a pallet was measured at varying pulse energies. The threshold energy for 1002F pallet release tended to be about 3.5 µJ. For comparison the threshold energy for identical-sized SU-8 pallets was 2.0 µJ. While the energy for 1002F pallet release was greater than that for SU-8 pallets, successful release and collection of living cells on SU-8 pallets has been performed with laser release energies up to 10 µJ. Thus the 1002F pallets should be suitable for sorting many different types of cells.

There are several possible reasons for the higher energies required to detach the 1002F pallets from the underlying glass surface relative to that for the SU-8 pallets. 1002F has only two epoxide groups per monomer unlike SU-8 which possesses 8 epoxides per monomer. Thus while the SU-8 polymer is extensively crossed linked, 1002F is a linear, uncrossed-linked polymer. As a result, 1002F is a softer, more flexible material than SU-8. This difference is also observed when films of 1002F and SU-8 are fabricated. The softer, more flexible 1002F may absorb more mechanical energy before the contact with the glass is disrupted. In addition these features may also afford 1002F with a greater number of molecular interactions with the glass surface permitting a tighter bonding than that possible for the rigid SU-8. Alternatively, the lower absorbance of 1002F compared to that of SU-8 near 532 nm may result in the conversion of a smaller fraction of the laser light into mechanical release energy and subsequent pallet detachment.

The embodiments discussed herein are meant to be illustrative examples and not exhaustive of the types of processing and uses of photosensitized Epon epoxy resin 1002F in the area of micromachining, for applications in microdevices and biomedical devices.

In the foregoing specification, the invention has been described with reference to specific embodiments thereof It will, however, be evident that various modifications and changes may be made thereto without departing from the broader spirit and scope of the invention. For example, the reader is to understand that the specific ordering and combination of process actions shown in the process flow diagrams described herein is merely illustrative, unless otherwise stated, and the invention can be performed using different or additional process actions, or a different combination or ordering of process actions. As another example, each feature of one embodiment can be mixed and matched with other features shown in other embodiments. Features and processes known to those of ordinary skill may similarly be incorporated as desired. Additionally, features may be added or subtracted as desired. Accordingly, the invention is not to be restricted except in light of the attached claims and their equivalents.

What is claimed:

1. A method for producing a microdevice or biomedical device comprising the steps of
   combining epoxy-based polymer resin with a solvent and a photoinitiator forming a photosensitive monomer mixture, the epoxy-based polymer resin containing only two (2) epoxide groups in its monomer form,
   placing a film layer of the monomer mixture on a substrate,
   exposing the film layer of monomer mixture to UV light through a mask to initiate cross linking of monomer structures within the monomer mixture exposed to the UV light, and
   stripping unlinked monomer structures within the monomer mixture not exposed to the UV light from the substrate.

2. The method of claim 1 wherein the solvent is y-Butyrolactone.

3. The method of claim 2 wherein the photoinitiator is triarylsulfonium hexafluoroantimonate salts mixed with propylene carbonate.

4. The method of claim 1 further comprising the step of raising the temperature of the film layer of monomer mixture after the step of exposing the mixture to UV light.

5. The method of claim 4 further comprising the step of baking the film layer of monomer mixture to form solid structures of linked polymer on the substrate.

6. The method of claim 5 further comprising the step of annealing the solid structures of linked polymer on the substrate by slow baking and cooling.

7. The method of claim 5 further comprising the step of embossing patterns into the surface of the solid structures of linked polymer on the substrate.

8. The method of claim 5 further comprising the step of adhering a material to the solid structures of linked polymer on the substrate.

* * * * *